United States Patent [19]
Engel et al.

[11] Patent Number: 4,737,676
[45] Date of Patent: Apr. 12, 1988

[54] TRANSDUCER WITH A FLEXIBLE PIEZOELECTRIC LAYER AS A SENSOR ELEMENT

[75] Inventors: Günter Engel, Graz; Peter W. Krempl, Graz/Ragnitz; Klaus-Christoph Harms; Helmut List, both of Graz, all of Austria

[73] Assignees: AVL Gesellschaft für Verbrennungskraftmaschinen und Messtechnik m.b.H.; Hans List, both of Graz, Austria

[21] Appl. No.: 942,783

[22] Filed: Dec. 17, 1986

[30] Foreign Application Priority Data

Dec. 20, 1985 [AT] Austria .................. 3718/85

[51] Int. Cl.⁴ .......................................... H01L 41/08
[52] U.S. Cl. ................... 310/330; 310/324; 310/338; 73/754
[58] Field of Search ............... 310/322, 324, 334, 360, 310/346, 800, 338, 330–332; 73/702, 704, 715, 716, 717, 753, 754, 730, 756, 119 A, DIG. 4

[56] References Cited

U.S. PATENT DOCUMENTS

| | | | |
|---|---|---|---|
| 3,486,046 | 12/1969 | Zalar | 310/324 |
| 4,004,409 | 1/1977 | Ganter et al. | 310/324 |
| 4,176,524 | 12/1979 | Kamiyama et al. | 310/324 X |
| 4,193,010 | 3/1980 | Kompanek | 310/324 X |
| 4,216,403 | 8/1980 | Krempl et al. | 310/800 X |
| 4,304,126 | 12/1981 | Yelke | 310/800 X |
| 4,533,907 | 8/1985 | Thatcher | 310/324 X |
| 4,541,284 | 9/1985 | Guagliumi et al. | 73/730 |
| 4,600,855 | 7/1986 | Strachan | 310/338 |
| 4,642,508 | 2/1987 | Suzuki et al. | 310/324 X |

FOREIGN PATENT DOCUMENTS

| | | | |
|---|---|---|---|
| 375466 | 8/1984 | Austria . | |
| 2832714 | 9/1980 | Fed. Rep. of Germany . | |
| 0137319 | 8/1983 | Japan | 310/324 |
| 0027699 | 2/1984 | Japan | 310/324 |
| 0072277 | 4/1985 | Japan | 310/324 |

OTHER PUBLICATIONS

Brushed-On Piezoelectric Transducers, by J. G. Martner, *Ultrasonics*, Oct. 1969, vol. 7, No. 4, pp. 234–237.

*Primary Examiner*—Mark O. Budd
*Attorney, Agent, or Firm*—Watson, Cole, Grindle & Watson

[57] ABSTRACT

A transducer comprising a flexible piezoelectric layer as a sensor element for measuring mechanical quantities in hollow bodies, above all pressures in pipes, the opposite sides of this layer being bonded to electrically-conductive contact layers and being connectable via leads to a display and evaluation unit. In order to achieve a high temperature stability in such transducers and to make them suitable for use at temperatures exceeding 80° C., the piezoelectric layer is proposed to consist of wurtzite or sphalerite. One of the electrically-conductive contact layers can be of some heat-resistant, flexible supporting material, for instance flexible metal foil, such as Cu-Be foil, or a sheet of plastic, one or both of whose sides are metallized, and the other electrically-conductive contact layer can be a metal coating applied by evaporation.

7 Claims, 1 Drawing Sheet

TRANSDUCER WITH A FLEXIBLE PIEZOELECTRIC LAYER AS A SENSOR ELEMENT

BACKGROUND OF THE INVENTION

This invention relates to a transducer comprising a sensor element for measuring mechanical quantities in hollow bodies, above all pressures in pipes, which sensor element consists of a flexible piezoelectric layer, the opposite surface of the sensor element being bonded to electrically-conductive contact layers and being connected via leads to a display and evaluation unit.

DESCRIPTION OF THE PRIOR ART

A transducer of this kind is described in AT-PS No. 375 466, comprising a sensor element which is made of a piezoelectric layer provided with a conductive coating on either side, and which is applied on a flexible plastic tape or bonded between two such tapes. In transducers of this kind suitable pretreated polyvinylidene fluoride sheets are used for the piezoelectric layer. Such transducers are very well suited for registering pressure changes in pipes, for example; in such instances the transducer is attached to the pipe to be monitored by means of a simple clip, for example.

Another transducer is described in U.S. Pat. No. 4,541,284, in which only the edges of the electrodes are bonded to a is in contact with a substrate only via a frame of the sensor element. If such transducers are not mounted correctly they are prone to errors.

With transducers of the above types, thermal loads must be kept low, however, and they cannot be used at temperatures exceeding 80° C. This temperature limit is due to the origin of the piezo-effect in piezo-polymer sheets: polar molecular groups whose spontaneous polarisations cancel each other out in the untreated polymer because of their random distribution of direction, are oriented by stretching the sheet in the presence of a strong electrical field; for this purpose the polar molecular groups must be easily rotatable.

This very ease of rotation will cause a rapid drop in overall polarisation, however, in case of temperature rises. Any attempts to "anchor" the polar groups will result in optimized manufacturing processes which cannot be improved indefinitely without impairing other characteristics.

This limit thermal stability is an intrinsic fault of all piezo-polymer sheets and is not confined to polyvinylidene fluoride. Despite this fault the stability of the material as such may be satisfactory.

In addition, there is some difficulty in bonding the piezoelectric sheet and its conductive coating to plastic tapes.

SUMMARY OF THE INVENTION

It is an object of the present invention to propose a transducer of the aforementioned type which can be subjected to high thermal loads.

According to the present invention this is achieved by making the sensor element or rather the piezoelectric layer material which is heat resistant up to at least 80° C., e.g., wurtzite or sphalerite, and to apply this layer over the entire surface of a heat-resistant, flexible supporting material, for instance flexible metal foil, such as Cu-Be foil, or metallized surface of a sheet of plastic, and further by providing the piezoelectric substrate with an electrically-conductive coating serving as a second electrode, e.g., a metal coating applied by evaporation. The above process will ensure a high thermal stability while the use of thin metal foils or metallized plastic sheets carrying thin piezoelectric coatings, will permit the transducer to remain flexible and enable it to be attached to pipes by means of a simple clip, for example. These flexible substrates may be selected according to the thermal stability desired; because of their electrical conductivity the substrates proposed by the invention are used as electrodes at the same time.

According to another feature of the invention the transducer is made by directly spraying a piezoelectric film, for instance of wurtzite, sphalerite, etc., onto a flexible metal foil, e.g., Cu-Be foil, or onto the metal surface of a plastic sheet, one of whose sides at least has been metallized, and by applying as a second electrode an electrically-conductive coating, e.g., a metal film, on the piezoelectric substrate, for instance by evaporation. In this manner very thin layers may be applied on the flexible substrate. This will permit a much simpler manufacture of transducers than the one described in AT-PS No. 376 466.

As proposed in DE-AS No. 28 32 714, crystalline piezoelectric layers may be applied to metals, glass, ceramics, monocrystals, resins and rubbers. Such layers are always applied to solid blocks of supporting material, however, which would only permit manufacture of rigid transducers; flexible transducers could not be obtained with this method. Since rigid transducers are more awkward to fasten than flexible ones, it is more difficult to design suitable devices for mounting them on the parts to be monitored.

In a further development of the invention the proposal is put forward that the second electrode be applied to the piezoelectric substrate at the same time or during the same operating cycle as the piezoelectric substrate is applied to the flexible metal foil or to the metal surface of a plastic sheet metallized on one or both sides—which will greatly simplify the production process.

Suitable materials for the piezoelectric substrate according to the invention should be easy to apply in thin layers, for example by evaporation techniques, oriented crystal growth (=epitaxy), molecular beam epitaxy, ion beam epitaxy, ionic implantation, CVD (chemical vapour deposition), cathode sputtering, and should be able to sustain high thermal loads. In this context crystals of the wurtzite group are particularly recommended; ranked according to the magnitude of the piezo-coefficient $d_{33}$, these are ZnO, CeS, CdSe, —ZnS, AlN, BeO. Of the above crystals, ZnO and AlN are the best electrical insultors; at the same time they permit an easy orientation of the c-axis during manufacture. Other examples include the crystals $Bi_{12}GeO_{20}$ and $Bi_{12}SiO_{20}$.

DESCRIPTION OF THE DRAWINGS

Following is a more detailed description of the invention as illustrated by the accompanying drawings, in which.

Metallic parts are represented by hatched areas, substrates by dotted areas, and all polymer materials are hatched and dotted.

Figure 1:
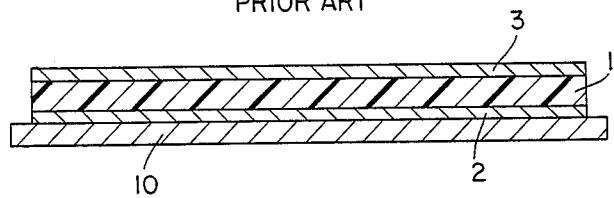
FIG. 1 presents a conventional transducer.

FIG. 1 shows a conventional transducer comprising a piezoelectric polymer layer 1, both sides of which are evaporation-coated with electrically conductive contact layers 2,3 serving as contacts, the contacted polymer layer 1 being bonded to a metal supporting foil 10.

DESCRIPTION OF THE PREFERRED EMBODIMENTS

Figure 2:
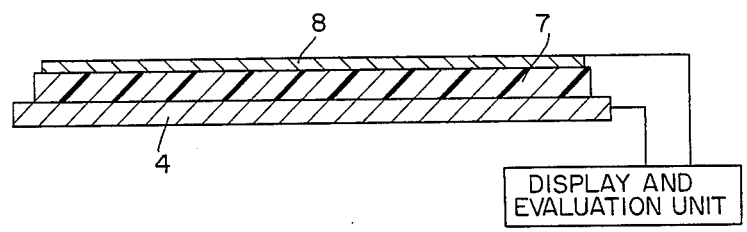
FIGS. 2, 3 show variants of a transducer as proposed by the invention.

FIG. 2 shows a transducer according to the present invention. An elongated flexible metal foil 4, e.g., made of Cu-Be, is coated with an elongated thin layer of some piezoelectric substrate 7, onto which an elongated second electrode 8 is applied, for instance by evaporation or by reactive cathode sputtering. The foil 4 and the second electrode 8 are connected by separate leads to a display and evaluation unit.

Figure 3:
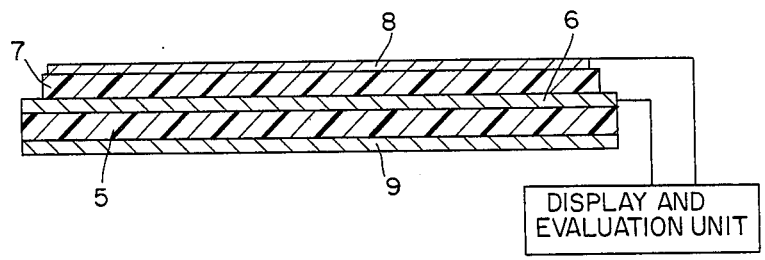

FIG. 3 shows a transducer as according by the invention, in which the piezoelectric substrate 7 is applied on the metal layer 6 of a metallized plastic foil 5. The substrate 7 is covered by a second electrode 8. The metal layer 6 and the second electrode 8 are connected by separate leads to a display and evaluation unit. The plastic foil 5 may also be metallized on both sides, i.e., have another metal layer 9.

In the variants presented in FIGS. 2 and 3 the piezoelectric substrate 7 is applied directly onto the metal foil 4 or the metal layer 6, forming a permanent bond. If the second electrode 8 is being applied to the substrate 7 at the same time, e.g., as a metallic film applied by evaporation-coating, the time for manufacturing will be further reduced.

Such transducers may be attached to pipes or tubes needing monitoring, e.g., the injection line of a diesel engine, by wrapping the transducer around the pipe. In such instances a strip of plastic may be inserted between the pipe and the transducer as an electrical insulator. The transducer may be fastened by means of a clip extending over more than half of the circumference of the pipe, for instance as shown in FIGS. 6 and 7 of AT-PS No. 375 466, the mounted clip being slightly pressed apart by the pipe and the transducer, thus preloading the transducer to a certain extent. If metal foil is used as a flexible substrate, the transducer may be directly contacted at this substrate.

If some metallized plastic foil is used as a substrate, however, contacting may be achieved through the plastic foil.

In addition, a transducer as described by the present invention may simply be attached to a pipe with a kind of cable-tie, in which case a strip of insulating plastic foil may again be inserted between pipe and transducer, in order to avoid electrical contact between the two, or between the transducer and the cable-tie.

We claim:

1. A flexible transducer which can be attached to a hollow body to measure a mechanical condition thereof, said transducer comprising an elongated heat-resistant, flexible metal foil having a first surface and a second surface; an elongated flexible piezoelectric substrate having a first surface and a second surface, the first surface of said flexible piezoelectric substrate contacting and covering the entire second surface of said heat-resistant, flexible metal foil, said flexible piezoelectric substrate being heat resistant up to at least 80° C. and made of a material selected from the group consisting of wurtzite and sphalerite; and an elongated coating of an electrically-conductive material on the second surface of said flexible, piezoelectric substrate; said heat-resistant, flexible metal foil and said coating of an electrically-conducting material being connectable to electrical leads.

2. A flexible transducer according to claim 1, wherein said heat-resistant, flexible metal foil is composed of Cu-Be.

3. A flexible transducer according to claim 1, wherein said coating of electrically-conducting material is made of metal.

4. A flexible transducer which can be attached to a hollow body to measure a mechanical condition thereof, said transducer comprising an elongated heat-resistant, flexible sheet of plastic having opposite sides, at least one of said opposite sides being metallized; an elongated flexible piezoelectric substrate having a first surface and a second surface, the first surface of said flexible piezoelectric substrate contacting and covering the entirety of one of the metallized surfaces of said heat-resistant, flexible sheet of plastic, said flexible piezoelectric substrate being heat resistant up to at least 80° C. and made of a material selected from the group consisting of wurtzite and sphalerite; and an elongated coating of an electrically-conductive material on the second surface of said flexible, piezoelectric substrate.

5. A flexible transducer according to claim 4, wherein said coating of electrically-conducting material is made of metal.

6. The combination of a pipe and a flexible transducer partially wrapped therearound to measure a mechanical condition of said pipe, said flexible transducer comprising an elongated heat-resistant, flexible metal foil having a first surface and a second surface; an elongated flexible piezoelectric substrate having a first surface and a second surface, the first surface of said flexible piezoelectric substrate contacting and covering the entire second surface of said heat-resistant, flexible metal foil, said flexible piezoelectric substrate being heat resistant up to at least 80° C. and made of a material selected from the group consisting of wurtzite and sphalerite; and an elongated coating of an electrically-conductive material on the second surface of said flexible, piezoelectric substrate; said heat-resistant, flexible metal foil and said coating of an electrically-conductive material being connectable to electrical leads.

7. The combination of a pipe and a flexible transducer partially wrapped therearound to measure a mechanical condition of said pipe, said flexible transducer comprising an elongated heat-resistant, flexible sheet of plastic having opposite sides, at least one of said opposite sides being metallized; an elongated flexible piezoelectric substrate having a first surface and a second surface, the first surface of said flexible piezoelectric substrate contacting and covering the entirety of one of the metallized surfaces of said heat-resistant, flexible sheet of plastic, said flexible piezoelectric substrate being heat resistant up to at least 80° C. and made of a material selected from the group consisting of wurtzite and sphalerite; and an elongated coating of an electrically-conductive material on the second surface of said flexible, piezoelectric substrate.

* * * * *

UNITED STATES PATENT AND TRADEMARK OFFICE
CERTIFICATE OF CORRECTION

PATENT NO. : 4,737,676
DATED      : April 12, 1988
INVENTOR(S): Günter Engel et al.

It is certified that error appears in the above-identified patent and that said Letters Patent is hereby corrected as shown below:

On the title page assignee should read

-- [73]  Assignee:  AVL Gesellschaft für Verbrennungskraftmaschinen und Messtechnik m.b.H.Prof.Dr.Dr.h.c. Hans List, Graz, Austria --.

Signed and Sealed this

Thirtieth Day of August, 1988

*Attest:*

DONALD J. QUIGG

*Attesting Officer*    Commissioner of Patents and Trademarks